United States Patent [19]

Carlson et al.

[11] 4,023,258
[45] May 17, 1977

[54] METHOD OF MANUFACTURING SEMICONDUCTOR DIODES FOR USE IN MILLIMETER-WAVE CIRCUITS

[75] Inventors: Eric Robert Carlson, Fair Haven; Arno Allan Penzias, Highland Park; Martin Victor Schneider, Holmdel, all of N.J.

[73] Assignee: Bell Telephone Laboratories, Incorporated, Murray Hill, N.J.

[22] Filed: Mar. 5, 1976

[21] Appl. No.: 664,245

[52] U.S. Cl. .................................. 29/578; 29/583; 29/590; 29/591; 156/645; 156/659; 357/55; 357/65
[51] Int. Cl.² ................. B01J 17/00; H01L 21/302
[58] Field of Search ........... 29/580, 583, 590, 591, 29/582, 578; 148/177, 175; 357/89, 55, 65; 156/5, 6, 17, 13, 153; 96/36; 427/88

[56] References Cited

UNITED STATES PATENTS

| | | | |
|---|---|---|---|
| 3,151,007 | 9/1964 | Dahlberg | 148/177 |
| 3,670,404 | 6/1972 | Kamoshida | 29/580 |
| 3,775,200 | 11/1973 | de Nobel et al. | 156/17 |
| 3,781,975 | 1/1974 | Ressel et al. | 29/583 |
| 3,897,627 | 8/1975 | Klatskin | 29/578 |
| 3,962,713 | 6/1976 | Kendall et al. | 357/55 |
| 3,972,113 | 8/1976 | Nakata et al. | 29/583 |

*Primary Examiner*—Douglas J. Drummond
*Assistant Examiner*—Jerome W. Massie
*Attorney, Agent, or Firm*—Daniel D. Dubosky

[57] ABSTRACT

A new method of semiconductor diode processing is described in which the resulting diode chips have an ohmic contact on four side faces of the chip. This is accomplished by cutting notches in the back side of a semiconductor slice before processing and by breaking the slice along the notches after fabricating the diodes on the front side of the slice. The new diode chip has a smaller series resistance than conventional millimeter-wave structures, and it can be readily bonded or soldered to millimeter-wave thin film circuits.

5 Claims, 7 Drawing Figures

METHOD OF MANUFACTURING SEMICONDUCTOR DIODES FOR USE IN MILLIMETER-WAVE CIRCUITS

BACKGROUND OF THE INVENTION

Millimeter-wave integrated circuits are being increasingly used for communication and scientific purposes because of their many desirable properties. In these millimeter-wave integrated circuits, metallic conductors are established on an insulating substrate by the process of photolithography and semiconductor devices are then mounted on these conductors. One difficulty with the use of millimeter-wave integrated circuits at very short wave lengths is the lack of a satisfactory method of mounting the semiconductor devices on the circuits.

In order to utilize fully the high frequency performance characteristics of millimeter-wave semiconductor diodes these diodes must be mounted in the circuit in a way which introduces a minimum amount of parasitic reactance. The waveguide mount known in the prior art as the Sharpless wafer is one of the closest approximations to an optimum configuration of the device. This type of semiconductor diode is disclosed in the article entitled "Wafer-Type Millimeter Wave Rectifier" by W. M. Sharpless, *Bell System Technical Journal*, Vol. 35, 1956, pp. 1385-1402. The Sharpless type of semiconductor diode has a rectifying contact on one surface of a semiconductor chip and an ohmic contact on the opposite surface of the chip. This type of diode chip can be mounted in a waveguide with the ohmic contact attached to one wall of the waveguide and contact is established to the opposite surface of the chip by means of a spring coming from the opposite wall of the waveguide. Because this spring contact is perpendicular to the diode face, stray capacitance across the diode is minimized. Series inductance is minimized by making the spring as short as possible.

It is also possible to mount the Sharpless wafer in the stripline geometry of a millimeter-wave integrated circuit. FIG. 1 of the drawings shows a directly adapted version of the prior art waveguide mounting in which the same type of diode is mounted in a millimeter-wave integrated circuit. The chip designated 100 in FIG. 1 is cut small enough to meet the dimensional requirements of the stripline. It is mounted to the stripline by being set on its side and soldering the ohmic contact on its back surface 110 to a conductor 101 on a ceramic or glass substrate 105 in the millimeter-wave integrated circuit. Since the chip 100 only has an ohmic contact on its back surface, when set on its side as shown in FIG. 1, the solder which holds this chip to the stripline conductor assumes the shape of a fillet 102. A metallic spring 103 is mounted on a second conductor 104 and the pointed edge of the spring is positioned so as to contact a rectifying contact on chip 100.

The semiconductor diode chips of the prior art have a gold contact suitable for soldering only on the back surface of the chip because the sequence of processes required to make millimeter-wave Schottky-barrier diodes requires that the ohmic contact be alloyed to the back of the semiconductor wafer before the diodes are formed on the front surface of the wafer. The ohmic contact must be made first otherwise the alloying step required to diffuse the contact into the semiconductor would destroy the diodes on the front surface as well. After the diodes are formed on the front surface the wafer is sawed into chips with the desired dimensions. It is not feasible technically or economically to cut the wafer first and process the chips individually. Two problems are confronted with the configurations shown in FIG. 1. First, the solder bond between the chip and stripline conductor must be a fillet joint because the sides of the chip are not able to be soldered. This joint is difficult to accomplish and is mechanically unreliable. Second, the small chip size required for millimeter-wave circuits is difficult to achieve since the epitaxial layer is susceptible to damage during the final process of sawing the wafer into chips. Such damage can extend about 0.001 to 0.002 inch from the edge of a cut and a minimum chip size is set by the need to have an undamaged area in the center of the chip.

SUMMARY OF THE INVENTION

The above-mentioned problems have been overcome by use of the present invention wherein the back surface of a semiconductor wafer is first notched by a series of saw cuts spaced so as to section the wafter into chips but these cuts only extend approximately halfway into the wafer. After notching the back surface, the ohmic contact is established by depositing and alloying a metal contact on the back surface of the semiconductor wafer including the sides of the notches. Rectifying contacts are then established on the front of the semiconductor wafer by a normal process. After establishing the diodes on the front surface the wafer is then broken along the fracture lines generally following the saw cuts produced during the notching processes. The resulting notch-back chip can then be soldered into a millimeter-wave integrated circuit with solder adhering both to the bottom and along three edges of the chip yielding excellent mechanical and electrical results.

BRIEF DESCRIPTION OF THE DRAWING

The invention will be more readily understood after reading the following detailed description in conjunction with the drawings wherein.

DETAILED DESCRIPTION

Figure 1:
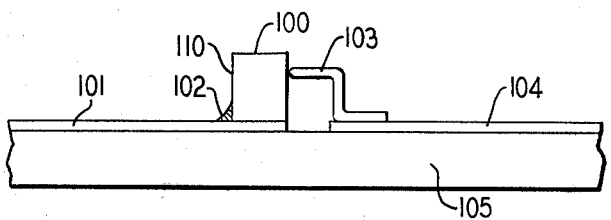
FIG. 1 is a pictorial representation of a millimeter-wave integrated circuit using a prior art type diode.
Figure 2:
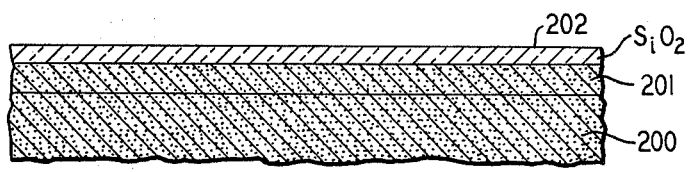
FIG. 2 is a cross-sectional representation of the top surface of a semiconductor wafer used in the present process.

A cross-sectional view of the top surface of a semiconductor wafer that is used in the present process is shown in FIG. 2. As illustrated in FIG. 2 a semi-conductor material 200 such as silicon or gallium arsenide is topped with an epitaxial layer 201, and this layer is covered with a silicon-dioxide layer 202. The silicon-dioxide layer can be established on a typical semiconductor wafer by vapor phase deposition.

Figure 3:
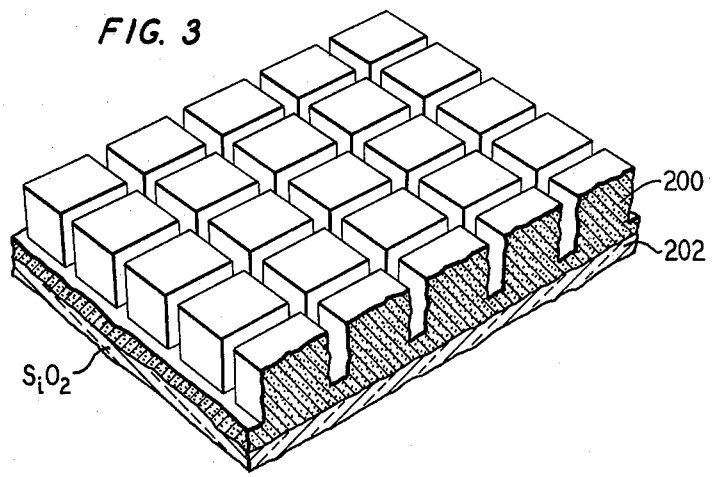
FIG. 3 is a pictorial cross-sectional representation of the semiconductor wafer after the wafer has been notched in a grid-like pattern.

Using a diamond saw, notches are cut in the back surface of the semiconductor wafer in a grid-like pattern thereby sectioning the semiconductor wafer into areas having the desired dimensions of the diode chips being manufactured. A pictorial cross-sectional representation of the semiconductor wafer after the notches have been created is shown in FIG. 3. As indicated in FIG. 3, the notches are cut to a depth of approximately one-half of the thickness of the semiconductor slice. As further indicated in FIG. 3 these notches create side surfaces that are substantially flat and perpendicular to the top surface of the semiconductor wafer. The width of the notches illustrated in FIG. 3 has been exaggerated in size relative to the diameter of the wafer for the purpose of illustrating the shape and depth of the notches.

Figure 4:
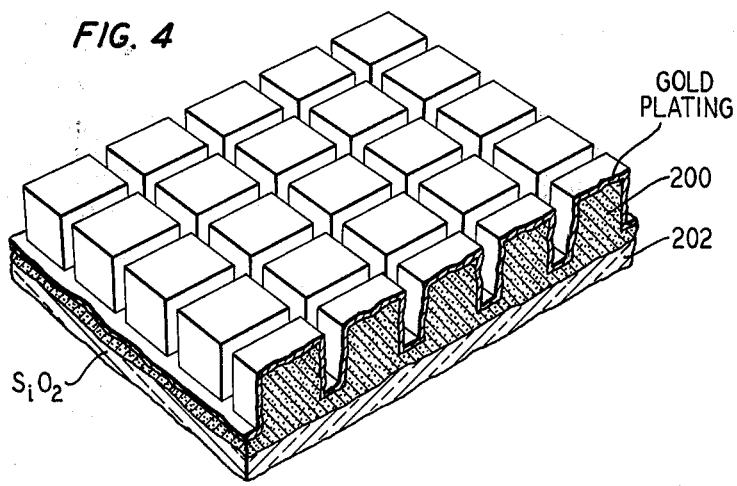
FIG. 4 is a pictorial cross-sectional representation of the semiconductor wafer after an ohmic contact has been established on the back surface of the semiconductor wafer including the walls of the notches.

After the notches have been cut in the back surface the notched side of the semiconductor wafer is plated with a conducting material such as gold by depositing the metal through a process of electroplating or evaporation. All exposed areas of the back surface of the semiconductor wafer including the walls and floors of the notches are coated during the plating process. The entire semiconductor wafer is then heated in order to alloy the metal to the semiconductor material thereby forming a good ohmic contact. The resulting semiconductor wafer with the plated notches is illustrated in FIG. 4.

After the plating process the silicon-dioxide side or front surface of the semiconductor wafer is coated with a negative photoresist material. This photoresist material on the front surface of the wafer is then exposed to ultraviolet light through a mask having a plurality of closely spaced black dots. The size of each dot is caused to be equal to the diameter of the rectifying contact to be established with the epitaxial layer. The dots are closely spaced in a pattern such that a plurality of dots exist on each area of the front face of the wafer corresponding to a single area defined by the walls of the notches on the back surface of the wafer. After exposure the photoresist material is then developed. All areas of the photoresist material that have been exposed to ultraviolet light become hard during the developing process. In the present process where black dots have been present on the mask, the areas under the black dots have not been exposed to ultraviolet light and the photoresist material in these areas is washed away using an appropriate solvent. To insure removal of all of the solvent the semiconductor wafer is then baked.

After the unexposed photoresist material has been removed by the solvent, the semiconductor wafer is left with a plurality of holes in the hardened photoresist material with the silicon-dioxide layer exposed in the holes. A suitable etching solution such as buffered hydrofluoric acid is then utilized to etch away the exposed silicon-dioxide layer down to the epitaxial layer of the semiconductor wafer. The remaining photoresist is then dissolved by using a stripper or a plasma strip in an oxygen atmosphere. This remaining photoresist material may also be removed through a mechanical process utilizing abrasion.

Figure 5:
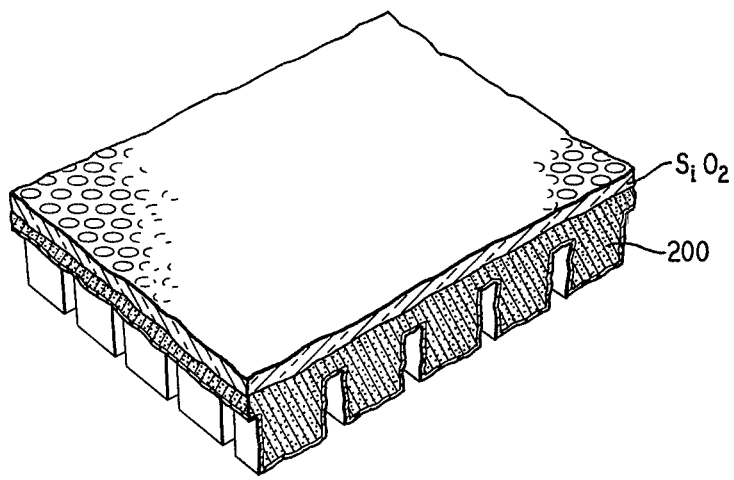
FIG. 5 is a pictorial cross-sectional representation of the semiconductor wafer after Schottky-barrier diodes have been established on the top surface of the wafer.

After the photoresist material has been entirely removed a good conducting material such as gold is then deposited in the holes of the silicon-dioxide layer by using a process of electroplating or evaporation. After this metallic plating in the process there is no need to heat in order to alloy because this conductive material in the holes of the silicon-dioxide layer has been placed in contact with the epitaxial layer for the purpose of establishing a rectifying contact of the type known in the art as a Schottky-barrier contact. At this point in the process, the semiconductor wafer has its front surface covering with a plurality of rectifying contacts as illustrated in FIG. 5.

Figure 6:
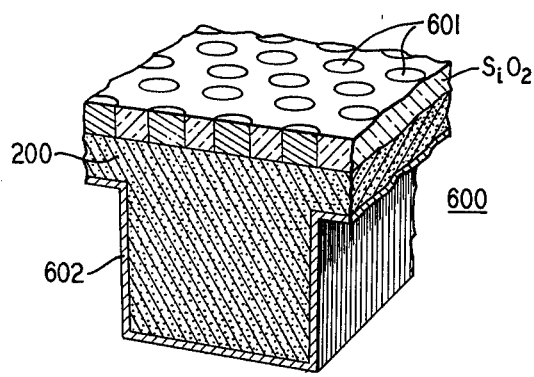
FIG. 6 is a pictorial cross-sectional representation of a single semiconductor diode after the wafer has been broken into a plurality of individual chips.

The semiconductor wafer is then broken apart along fracture lines that have been created in the slice during the notching process. These fracture lines generally follow the grid-like pattern of the notches. A cross-sectional view of one individual chip that is created by the breaking step in the process is illustrated in FIG. 6. As illustrated in FIG. 6 this single chip 600 has a plurality of rectifying contacts designated as 601 in FIG. 6, and the sides and bottom surface of the chip are coated with a gold ohmic contact designated as 602 in FIG. 6.

Figure 7:
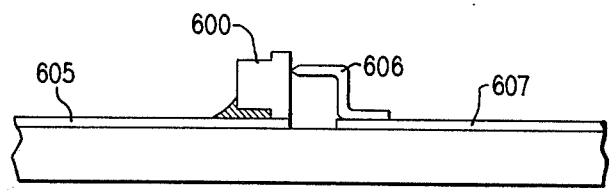
FIG. 7 is a pictorial representation of a thin-film stripline on which a diode constructed in accordance with the present invention has been mounted.

This individual chip 600 may now be mounted in a mullimeter-wave thin-film integrated circuit in a fashion illustrated in FIG. 7. As indicated in FIG. 7 the individual chip is mounted on the thin film by soldering the back surface and three of the four sides to the conducting stripline 605. As further indicated in FIG. 7, the faces created by the notching process, which faces are substantially flat and perpendicular to the top surface of the semiconductor wafer, permit the resulting individual chip to be mounted to the thin-film with the top surface of the chip substantially perpendicular to the thin-film stripline 605. As in the case of the prior art diode a spring member 606 is mounted to a second stripline 607 and this spring member is positioned so as to establish a pointed contact with one of the rectifying contacts 601 on the top side of the individual chip. As a result of this type of mounting made possible by having ohmic contacts on the side surfaces of the chip, the joint established between the chip and the stripline in FIG. 7 is more mechanically and electrically stable than the joint created with prior art diodes.

The foregoing is a description of a specific process that can be utilized to practice the present invention. Numerous modifications may be made by those skilled in the art without departing from the spirit and scope of the present invention.

What is claimed is:

1. A method of manufacturing millimeter-wave semiconductor diodes from a semiconductor wafer having an epitaxial layer and an insulating layer on the front surface of the wafer comprising the steps of notching the back surface of the semiconductor wafer in a grid-like pattern with the notches extending to a depth of approximately one-half the thickness of the semiconductor wafer thereby creating side surfaces in said wafer which are substantially flat and perpendicular to the front surface of said wafer, plating the back surface of the said semiconductor wafer including the walls created by said notching step with a conductive material, heating the semiconductor wafer to alloy the material on the back plated surface and walls of said notches, fabricating a plurality of diodes on the front surface of the semiconductor wafer with at least one diode for each of the areas created by said grid-like pattern at a point in time subsequent to heating the semiconductor wafer, and thereafter separating the semiconductor wafer along the notches in order to create a plurality of individual chips.

2. A process as defined in claim 1 for manufacturing semiconductor diodes wherein the step of fabricating a plurality of diodes includes the steps of creating holes in the insulating layer in order to expose the epitaxial layer in a plurality of locations over the front surface of the semiconductor wafer and depositing a conductive metal in the holes of said insulating layer in order to create rectifying contacts with said epitaxial layer.

3. A method for manufacturing semiconductor diodes as defined in claim 2 wherein the step of creating holes in said insulating layer includes the steps of coating the insulating layer with a photoresist material, exposing said photoresist material to suitable radiation through a mask having a plurality of darkened areas, developing said photoresist material, and dissolving the unexposed photoresist material with a suitable solvent.

4. A method of manufacturing millimeter-wave semiconductor diodes from a semiconductor wafer having a back surface and a front surface with an epitaxial layer comprising the steps of depositing an insulating layer on the front surface of said semiconductor wafer, cutting notches in the back surface of said semiconductor wafer in a grid-like pattern to a depth of approximately one-half the thickness of the semiconductor wafer thereby sectioning the semiconductor wafer into a plurality of individual, inseparated chips having side surfaces that are substantially flat and perpendicular to the front surface of said wafer, plating the back surface of said semiconductor wafer including the walls created by said notches with a metallic conductor, heating the semiconductor wafer so as to alloy the metal plating to the semiconductor material, fabricating diodes on the front surface of said semiconductor wafer at a point in time subsequent to heating the semiconductor wafer, and thereafter separating the semiconductor wafer into individual chips along the lines created by said grid-like pattern.

5. A method of manufacturing semiconductor diodes as defined in claim 4 wherein the step of fabricating diodes on the front surface includes the steps of coating said insulating layer with a photoresist material, exposing said photoresist material to suitable radiation through a mask having a plurality of darkened areas, developing said photoresist material, dissolving the unexposed photoresist material so as to expose a plurality of areas on said insulating layer, etching said exposed insulating layer to expose a plurality of areas on said epitaxial layer, and depositing a metallic conductor on the areas of exposed epitaxial layer.

* * * * *

UNITED STATES PATENT AND TRADEMARK OFFICE
CERTIFICATE OF CORRECTION

PATENT NO. : 4,023,258
DATED : May 17, 1977
INVENTOR(S) : Eric R. Carlson, Arno A. Penzias, Martin V. Schneider It is certified that error appears in the above-identified patent and that said Letters Patent are hereby corrected as shown below:

Column 2, line 13, "0.001 to 0.002 inch" should read --0.001 to 0.002 inches--. Column 4, line 22, "mullimeter" should read --millimeter--. Column 6, line 1 "inseparated chips" should read --unseparated chips--.

Signed and Sealed this

Eighteenth Day of March 1980

[SEAL]

Attest:

SIDNEY A. DIAMOND

Attesting Officer        Commissioner of Patents and Trademarks